(12) United States Patent
Takemoto

(10) Patent No.: US 9,697,930 B2
(45) Date of Patent: Jul. 4, 2017

(54) OXIDE SUPERCONDUCTOR WIRE AND METHOD OF MANUFACTURING OXIDE SUPERCONDUCTOR WIRE

(71) Applicant: FUJIKURA LTD., Koto-ku, Tokyo (JP)

(72) Inventor: Tetsuo Takemoto, Sakura (JP)

(73) Assignee: FUJIKURA LTD., Koto-ku, Tokyo (JP)

( * ) Notice: Subject to any disclaimer, the term of this patent is extended or adjusted under 35 U.S.C. 154(b) by 99 days.

(21) Appl. No.: 14/281,249

(22) Filed: May 19, 2014

(65) Prior Publication Data

US 2014/0323314 A1  Oct. 30, 2014

Related U.S. Application Data

(63) Continuation of application No. PCT/JP2012/080246, filed on Nov. 21, 2012.

(30) Foreign Application Priority Data

Nov. 21, 2011 (JP) ................................. 2011-253796
Apr. 5, 2012 (JP) ................................. 2012-086409

(51) Int. Cl.
*H01B 12/00* (2006.01)
*H01L 39/00* (2006.01)
(Continued)

(52) U.S. Cl.
CPC .............. *H01B 12/06* (2013.01); *H01B 13/00* (2013.01); *H01L 39/143* (2013.01); *H01L 39/248* (2013.01)

(58) Field of Classification Search
CPC ......... H01B 12/00–12/06; H01B 13/00; H01L 39/143; H01L 39/248
See application file for complete search history.

(56) References Cited

U.S. PATENT DOCUMENTS

| 5,718,034 A | 2/1998 | Huang et al. |
| 2008/0004184 A1 | 1/2008 | Ohmatsu |
| 2009/0270263 A1 | 10/2009 | Aoki et al. |

FOREIGN PATENT DOCUMENTS

| CN | 101506100 A | 8/2009 |
| EP | 0291075 A2 | 11/1988 |

(Continued)

OTHER PUBLICATIONS

Communication dated Aug. 12, 2015 from the Russian Patent Office in counterpart application No. 2014120161/05.
(Continued)

*Primary Examiner* — Colleen Dunn
(74) *Attorney, Agent, or Firm* — Sughrue Mion, PLLC

(57) ABSTRACT

An oxide superconductor wire includes: a tape-shaped oxide superconductor laminate that is formed by providing an intermediate layer on a front surface side of a metal tape-shaped substrate, providing an oxide superconductor layer on the intermediate layer, and providing a protective layer on the oxide superconductor layer; and a coating member that includes a metal tape and a low melting point metal layer, in which the metal tape has a wider width than that of the oxide superconductor laminate and covers the protective layer surface of the oxide superconductor laminate, both side surfaces of the oxide superconductor laminate, and both end portions of a substrate back surface side in a width direction thereof, and both end portions of the metal tape in a width direction thereof are provided to cover both the end portions of the substrate back surface.

14 Claims, 7 Drawing Sheets

(51) Int. Cl.
*H01B 12/06* (2006.01)
*H01L 39/14* (2006.01)
*H01B 13/00* (2006.01)
*H01L 39/24* (2006.01)

(56) References Cited

FOREIGN PATENT DOCUMENTS

| | | |
|---|---|---|
| JP | 2009-503794 A | 1/2009 |
| JP | 2010-267822 A | 11/2010 |
| JP | 2011-003494 A | 1/2011 |
| JP | 2011-008949 A | 1/2011 |
| JP | 2011-009098 A | 1/2011 |
| JP | 2012-169237 A | 9/2012 |
| RU | 2392677 C2 | 6/2010 |
| WO | 2007/016492 A2 | 2/2007 |

OTHER PUBLICATIONS

Communication dated May 22, 2015 from the European Patent Office in counterpart European Application No. 12850982.5.
English Translation of JP2011008949A. (previously filed on May 19, 2014).
English Translation of JP2010267822A. (previously filed on May 19, 2014).
English Translation of JP2011009098A. (previously filed on May 19, 2014).
English Translation of JP2012169237A. (previously filed on May 19, 2014).
International Search Report of PCT/JP2012/080246 dated Feb. 26, 2013.

Prior Art

OXIDE SUPERCONDUCTOR WIRE AND METHOD OF MANUFACTURING OXIDE SUPERCONDUCTOR WIRE

CROSS REFERENCE TO RELATED APPLICATIONS

This application is a continuation application based on a PCT Patent Application No. PCT/JP2012/080246, filed Nov. 21, 2012, whose priority is claimed on Japanese Patent Application No. 2011-253796, filed Nov. 21, 2011 and Japanese Patent Application No. 2012-086409, filed Apr. 5, 2012, the entire content of which are hereby incorporated by reference.

BACKGROUND OF THE INVENTION

Field of the Invention

The present invention relates to an oxide superconductor wire and a method of manufacturing an oxide superconductor wire.

Description of the Related Art

A RE-123-based oxide superconductor ($REBa_2Cu_3O_{7-x}$: RE represents a rare earth element containing Y) exhibits superconductivity at a liquid nitrogen temperature. Since the RE-123-based oxide superconductor has low current loss, this RE-123-based oxide superconductor is processed into a superconductor wire to manufacture a superconductor or a superconducting coil for supplying power. As a method of processing this oxide superconductor into a wire, a method may be used, the method including: forming an oxide superconductor layer over a substrate as a metal tape with an intermediate layer interposed therebetween; and forming a stabilizing layer on the oxide superconductor layer.

A commonly-used oxide superconductor wire of the related art adopts a structure in which two stabilizing layers are laminated, the two stabilizing layers including: a thin silver stabilizing layer that is formed on an oxide superconductor layer; and a thick stabilizing layer that is formed on the thin silver stabilizing layer using a highly conductive metal material such as copper. The silver stabilizing layer is also provided for adjusting changes in oxygen content during an oxygen heat treatment of the oxide superconductor layer. The copper stabilizing layer functions as a bypass for commutating a current of the oxide superconductor layer when the oxide superconductor layer is transitioned from the superconducting state to the normal conducting state.

In addition, a RE-123-based oxide superconductor having a specific composition is likely to deteriorate due to moisture. Therefore, in a case where a superconductor wire is stored in an environment containing a large amount of moisture or where a superconductor wire is left to stand in a state where moisture is attached thereon, when moisture is infiltrated into the oxide superconductor layer, there is a concern that superconductivity may deteriorate. Accordingly, in order to secure long-term reliability of a superconductor wire, it is necessary that a structure for protecting the entire periphery of a superconductor layer with a layer be adopted.

As a structure of the related art for protecting the entire periphery of a superconductor layer, as in the case of a high-temperature superconductor wire disclosed in Published Japanese Translation No. 2009-503794 of the PCT International Publication, a structure including: a laminated structure in which two superconductor insert layers are laminated; and a nonporous electrically conductive filler such as solder which covers the laminated structure, is known. In addition, this high-temperature superconductor wire has a configuration in which both sides or four peripheries of the above-described laminate are surrounded by a metal stabilizer strip, and the inside of the stabilizer strip is filled with the nonporous electrically conductive filler.

In addition, as in the case of a reinforced high-temperature superconductor wire disclosed in Japanese Unexamined Patent Application, First Publication No. 2011-003494 including a tape-shaped oxide superconductor as a reinforcement structure, a structure including a tape-shaped high-temperature superconductor wire in which an intermediate layer and an oxide superconductor layer are laminated on a metal substrate is known, in which the high-temperature superconductor wire is covered with a C-shaped reinforcement tape wire both ends of which are bent, and at least a part of the high-temperature superconductor wire is soldered to the reinforcement tape wire.

In a superconductor wire including the above-described RE-123-based oxide superconductor layer, an oxide superconductor layer is laminated over a metal tape as a substrate with an intermediate layer interposed therebetween, and a thin silver stabilizing layer is laminated on the oxide superconductor layer. However, since this thin silver stabilizing layer is formed thin so as to adjust changes in oxygen content during a oxygen heat treatment, pin holes may be present thereon. In addition, the silver stabilizing layer is formed using a film forming method such as a sputtering method. Therefore, when a long superconductor wire is manufactured, there is a problem in that peeling, chipping, or the like is likely to occur. Further, a surface of the oxide superconductor layer is covered with the silver stabilizing layer, but side surfaces of the oxide superconductor layer are not covered with a layer. Accordingly, it is necessary that a countermeasure against moisture infiltration from the side surfaces be taken.

To that end, as disclosed in the above-described Patent documents, the structure in which the superconductor insert layers of the laminate structure are surrounded by the metal stabilizer strip or the structure in which the high-temperature superconductor wire is surrounded by the C-shaped reinforcement tape is considered to be effective. However, a structure in which a tape-shaped oxide superconductor is surrounded by a metal tape or the like and is fixed thereto through a solder has a problem in solder adhesion at an interface between a copper tape and an oxide superconductor. In addition, when even a small gap is formed in the entire periphery of a long superconductor wire, moisture may be infiltrated into the superconductor wire through the gap.

FIG. 8 illustrates an example of a structure which is made assuming that such an oxide superconductor is surrounded by a copper tape. In the structure illustrated in FIG. 8, a tape-shaped oxide superconductor laminate 104 is formed by laminating an oxide superconductor layer 102 and a silver stabilizing layer 103 over one surface of a metal tape-shaped substrate 100 with an intermediate layer 101 interposed therebetween. Further, an oxide superconductor 106 having a coating structure is formed by surrounding the periphery of the oxide superconductor laminate 104 with a copper tape 105. In the oxide superconductor 106 of this example, for example, a solder layer 107 is formed at an end portion of the copper tape 105. In addition, on a back surface of the substrate 100, end portions of the copper tape 105 are made to overlap each other and are soldered to each other such that the end portions of the copper tape 105 are integrated.

On the other hand, in the structure illustrated in FIG. 8 in which the oxide superconductor laminate 104 is surrounded by the copper tape 105, when overlapping portions of the copper tape 105 are soldered to each other, and when there are even a small amount of defects in solder joints over the entire periphery of the tape-shaped oxide superconductor laminate 104, moisture may be infiltrated thereinto, and moisture infiltration cannot be completely prevented.

In addition, in the oxide superconductor 106 having the structure of FIG. 8, the thickness of a portion of the copper tape 105 where one end overlaps the other end significantly varies. Accordingly, when the superconductor 106 is wound around a winding barrel to form a superconductive coil or the like, there is no problem in the case of one-layer winding, but there is a problem of irregular winding at an overlapping portion of the copper tape 105 in the case of multi-layer winding.

The present invention has been made in consideration of the above-described circumstances of the related art, and an object thereof is to provide an oxide superconductor wire in which a structure capable of preventing moisture infiltration is formed for an oxide superconductor layer inside the structure not to deteriorate. In addition, another object of the present invention is to provide an oxide superconductor wire in which irregular winding does not occur when the oxide superconductor wire is wound in a coil shape to form a superconductive coil or the like.

SUMMARY

In order to solve the above-described problems, according to a first aspect of the present invention, there is provided an oxide superconductor wire including: a tape-shaped oxide superconductor laminate including a metal tape-shaped substrate that has a substrate front surface and a substrate back surface, an intermediate layer that is provided on the substrate front surface, an oxide superconductor layer that is provided on the intermediate layer, and a protective layer that has a protective front surface and is provided on the oxide superconductor layer; and a coating member that is formed of a metal tape and a low melting point metal layer, in which the metal tape has a wider width than that of the oxide superconductor laminate and covers the protective front surface, both side surfaces of the oxide superconductor laminate, and both end portions of the substrate back surface in a width direction thereof, both end portions of the metal tape in a width direction thereof are provided to cover both the end portions of the substrate back surface, the low melting point metal layer fills gaps between the oxide superconductor laminate and the metal tape that is provided near the oxide superconductor laminate to join the metal tape and the oxide superconductor laminate to each other, and part of the filled low melting point metal layer extends to a recessed portion that is formed between both end portions of the metal tape in the width direction.

When the oxide superconductor wire according to the first aspect of the present invention is used, a structure is formed in which the periphery of the oxide superconductor laminate is covered with the low melting point metal layer which fills the gaps between the oxide superconductor laminate and the metal tape provided near the oxide superconductor laminate. As a result, moisture infiltration from the outside into the oxide superconductor layer positioned inside the metal tape can be prevented. Further, when the oxide superconductor wire according to the first aspect of the present invention is used, the gap portions between both the end portions of the metal tape and the substrate back surface are covered with the coating portions of the low melting point metal which protrude outward from the end portions of the metal tape covering the end portions of the substrate back surface. As a result, moisture infiltration from the end portions of the metal tape to the inside of the metal tape can be prevented.

The coating portions which are formed of the low melting point metal and extend outward from the end portions of the metal tape are positioned only inside the recessed portion between both the end portions of the metal tape, and the thickness of the protruding portions is not increased compared to the thickness of the metal tape. Accordingly, when the oxide superconductor wire including the coating portions of the low melting point metal on the substrate back surface is coiled, there is no significant step difference, and irregular winding is not likely to occur during coiling.

In the oxide superconductor wire according to the first aspect of the present invention, the recessed portion may be formed by being covered with a burying layer, and the burying layer may be formed of the low melting point metal layer that does not protrude outward from surface positions of both the end portions of the metal tape forming the recessed portion.

When the recessed portion between both end portions of the metal tape covering the end portions of the substrate back surface is filled with the burying layer of the low melting point metal, the gap portions between both the end portions of the metal tape and the substrate back surface are reliably covered with the low melting point metal. Accordingly, moisture infiltration from the end portions of the metal tape to the inside of the metal tape can be prevented. Further, the burying layer of the low melting point metal does not protrude outward from the surface positions of both the end portions of the metal tape forming the recessed portion. Accordingly, when the oxide superconductor wire in which the recessed portion between both the end portions of the metal tape is buried with the burying layer of the low melting point metal is coiled, there is no significant step difference, and irregular winding is not likely to occur during coiling.

In the oxide superconductor wire according to the first aspect of the present invention, an entire outer peripheral surface of the metal tape may be covered with the low melting point metal layer.

With this structure, the gap portion between both the end portions of the metal tape covering the end portions of the substrate back surface is filled with the burying layer of the low melting point metal, and the low melting point metal layer is formed on the burying layer. Accordingly, a structure is formed in which the low melting point metal layer is provided without a significant step difference on the gap portion between both end portions of the metal tape. As a result, when the oxide superconductor wire is coiled, there is no significant step difference, and irregular winding is not likely to occur during coiling.

In the oxide superconductor wire according to the first aspect of the present invention, each of coating widths of both end portions of the metal tape covering the end portions of the substrate back surface may be 0.75 mm or greater.

By controlling each coating width of the structures of the metal tape for covering the end portions of the substrate back surface to be 0.75 mm or greater, a structure having high reliability in preventing moisture infiltration can be formed.

In the oxide superconductor wire according to the first aspect of the present invention, it is preferable that a width of the recessed portion be 2.0 mm or less. When the width of the recessed portion is within the above-described range, the low melting point metal forming the burying layer is sufficiently spread out to the inside of the recessed portion by a surface tension, and thus a burying structure having high reliability can be realized.

In the oxide superconductor wire according to the first aspect of the present invention, the metal tape may be a copper tape having a thickness of 15 μm or greater.

It is preferable that the copper tape having a thickness of 15 μm or greater because the copper tape functions as a bypass for commutating a current when the oxide superconductor layer is switched from the superconducting state to the normal conducting state.

In the oxide superconductor wire according to the first aspect of the present invention, the burying layer may further contain another low melting point metal which is added from outside in addition to a part of the low melting point metal layer which fills the gaps between the oxide superconductor laminate and the metal tape.

When the burying layer is formed of only a part of the low melting point metal layer which fills the gaps between the oxide superconductor laminate and the metal tape provided near the oxide superconductor laminate, the amount of the low melting point metal may be insufficient. Therefore, by further adding a low melting point metal from the outside, the burying layer can be formed. In this case, even when there is a concern that the amount of the low melting point metal may be insufficient due to a large gap of the recessed portion, the recessed portion can be filled with a sufficient amount of the low melting point metal to form the burying layer.

According to a second aspect of the present invention, there is provided a superconducting coil including the oxide superconductor wire according to the first aspect of the present invention.

According to a third aspect of the present invention, there is provided a superconducting cable including the oxide superconductor wire according to the first aspect of the present invention.

According to a fourth aspect of the present invention, there is provided a method of manufacturing an oxide superconductor wire including: preparing a tape-shaped oxide superconductor laminate that is formed by providing an intermediate layer on a front surface side of a metal tape-shaped substrate, providing an oxide superconductor layer on the intermediate layer, and providing a protective layer on the oxide superconductor layer, and preparing a metal tape that has a wider width than that of the oxide superconductor laminate and includes peripheral surfaces on which a low melting point metal plating layer is formed; allowing the metal tape to cover the oxide superconductor laminate such that the protective layer surface of the oxide superconductor laminate, both side surfaces of the oxide superconductor laminate, and both end portions of a substrate back surface side in a width direction thereof are covered with the metal tape; and forming coating portions by heating the low melting point metal plating layer to a temperature to be in a melted state, pressing the low melting point metal layer with a roll such that gaps between the oxide superconductor laminate and the metal tape are buried with the low melting point metal layer, and allowing a part of the low melting point metal layer to extend outward from end portions of the metal tape covering the end portions of the substrate back surface.

By using this method, a structure in which the periphery of the oxide superconductor laminate is covered with the low melting point metal layer, and the metal tape is disposed outside the low melting point metal layer can be formed. Therefore, moisture infiltration from the outside to the oxide superconductor layer positioned inside the metal tape can be prevented. In addition, the end portions of the metal tape are covered with the coating portions formed of the low melting point metal which protrude outward from the gaps between the end portions of the metal tape, which cover the end portions of the substrate back surface, and the substrate back surface. Therefore, moisture infiltration from the gaps between both the end portions of the metal tape and the substrate back surface to the inside of the metal tape can be prevented.

The coating portions which are formed of the low melting point metal and protrude outward from the end portions of the metal tape are positioned only inside the gap portion between both the end portions of the metal tape. Due to the effect of the protruding portions, the thickness of the protruding portions is not increased compared to the thickness of the metal tape. Accordingly, when the oxide superconductor wire including the coating portions of the low melting point metal on the substrate back surface is coiled, there is no significant step difference, and irregular winding is not likely to occur during coiling.

In the method of manufacturing an oxide superconductor wire according to the fourth aspect of the present invention, a recessed portion which is formed between both end portions of the metal tape covering the end portions of the substrate back surface may be covered with a burying layer of a low melting point metal which does not protrude outward from an opening position of the recessed portion.

With this structure, the recessed portion between both the end portions of the metal tape covering the end portions of the substrate back surface is filled with the burying layer of the low melting point metal. Therefore, a structure in which the burying layer of the low melting point metal is provided without forming a protruding portion on the recessed portion between both the end portions of the metal tape can be formed. Accordingly, when the oxide superconductor wire is coiled, there is no significant step difference, and irregular winding is not likely to occur during coiling.

In the oxide superconductor wire according to the aspect of the present invention, a structure is formed in which the periphery of the oxide superconductor laminate is covered with the low melting point metal layer which fills the gaps between the oxide superconductor laminate and the metal tape provided near the oxide superconductor laminate. As a result, the oxide superconductor wire capable of preventing moisture infiltration from the outside into the oxide superconductor layer positioned inside the metal tape can be provided.

The end portions of the metal tape covering the end portions of the substrate back surface and the recessed portion formed between both the end portions of the metal tape and the substrate back surface are covered with the coating portions of the low melting point metal which are exposed to the outside. As a result, moisture infiltration from the end portions of the metal tape to the inside of the metal tape can be prevented.

DETAILED DESCRIPTION OF THE PREFERRED EMBODIMENTS

Hereinafter, embodiments of an oxide superconductor wire according to the present invention will be described based on the drawings.

Figure 1:
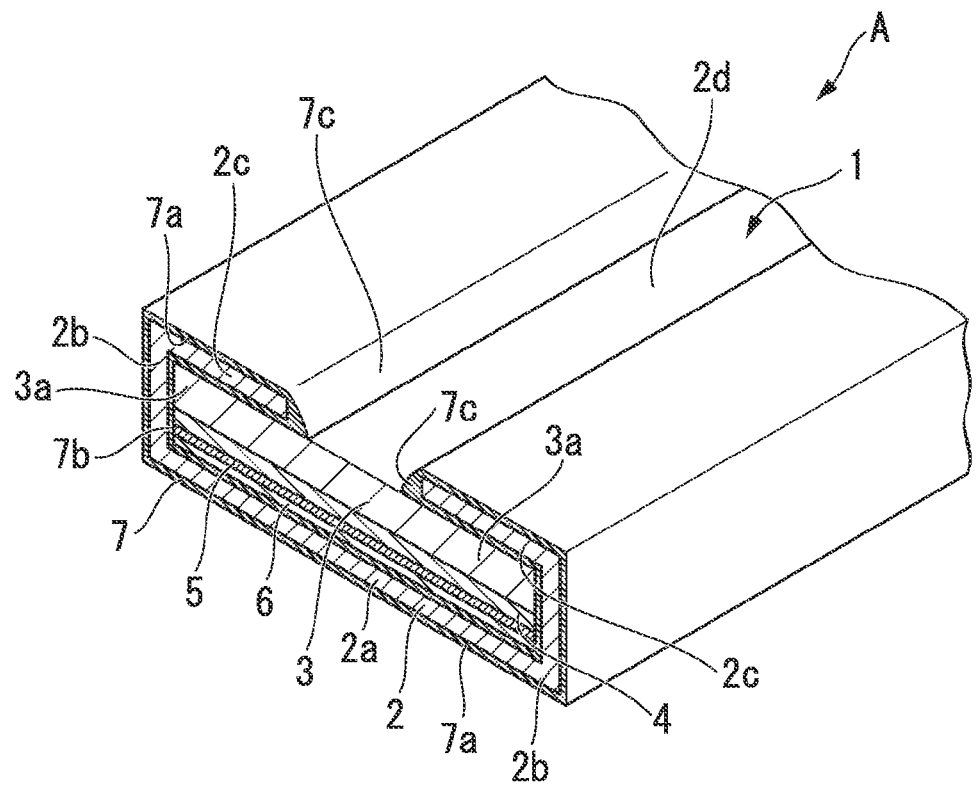
FIG. 1 is a perspective view illustrating an oxide superconductor wire according to a first embodiment of the present invention in which a part of the oxide superconductor wire is illustrated as a cross-section.

FIG. 1 is a perspective view illustrating an oxide superconductor wire according to a first embodiment of the present invention in which a part of the oxide superconductor wire is illustrated as a cross-section. In the oxide superconductor wire A of this embodiment, a tape-shaped oxide superconductor laminate 1 provided inside the oxide superconductor wire A is covered with a metal tape 2 which is formed of a conductive material such as copper.

Figure 2:
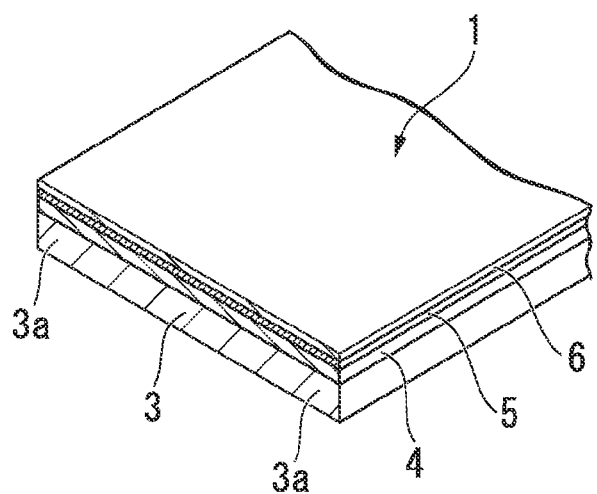
FIG. 2 is a partial cross-sectional perspective view illustrating an example of an oxide superconductor laminate in which the oxide superconductor wire illustrated in FIG. 1 is provided.

In the oxide superconductor laminate 1 of this example, as illustrated in FIG. 2, an intermediate layer 4, an oxide superconductor layer 5, and a protective layer 6 are laminated in this order on one surface side (lower surface side in FIG. 1) of a tape-shaped substrate 3.

In order to form a flexible superconductor wire, it is preferable that the substrate 3 have a tape shape and be formed of a heat-resistant metal. It is preferable that the substrate 3 be formed of a nickel alloy among various heat-resistant metals. Among nickel alloys, HASTELLOY (trade name, manufactured by Haynes International Inc.) is preferable. The thickness of the substrate 3 is typically between 10 μm and 500 μm. In addition, as the substrate 3, a textured Ni—W alloy tape substrate or the like in which a texture is introduced into a nickel alloy can also be applied.

As the intermediate layer 4, a structure in which an underlayer, an alignment layer, and a cap layer which are described below are formed can be applied as an example.

When the underlayer is provided, a multi-layer structure in which a diffusion prevention layer and a bed layer which are described below are formed or a structure in which one of the layers is formed can be adopted.

When the diffusion prevention layer is provided as the underlayer, a layer having a single-layer structure or a multi-layer structure which is formed of silicon nitride ($Si_3N_4$), aluminum oxide ($Al_2O_3$; also referred to as "alumina"), GZO ($Gd_2Zr_2O_7$), or the like is preferable, and the thickness of the diffusion prevention layer is, for example, between 10 nm and 400 nm.

When the bed layer is provided as the underlayer, the bed layer is used due to its high heat-resistance and for reducing interfacial reactivity and obtaining the orientation of a film formed on the bed layer. Such a bed layer is formed of, for example, a rare earth oxide such as yttria ($Y_2O_3$). Specific examples of the rare earth oxide include $Er_2O_3$, $CeO_2$, $Dy_2O_3$, $Er_2O_3$, $Eu_2O_3$, $Ho_2O_3$, and $La_2O_3$, and a single-layer structure or a multi-layer structure formed of these materials can be adopted. The thickness of the bed layer is, for example, between 10 nm and 100 nm. In addition, since the crystallinity of the diffusion prevention layer and the bed layer is not particularly limited, the diffusion prevention layer and the bed layer may be formed using an ordinary film forming method such as a sputtering method.

The alignment layer functions as a buffer layer for controlling the crystal orientation of the oxide superconductor layer 5 which is formed on the alignment layer. It is preferable that the alignment layer be formed of a metal oxide having high lattice matching performance with the oxide superconductor layer. Preferable examples of the material of the alignment layer include metal oxides such as $Gd_2Zr_2O_7$, MgO, $ZrO_2$—$Y_2O_3$(YSZ), $SrTiO_3$, $CeO_2$, $Y_2O_3$, $Al_2O_3$, $Gd_2O_3$, $ZrO_2$, $Ho_2O_3$, or $Nd_2O_3$. The alignment layer may have a single-layer structure or a multi-layer structure.

The alignment layer can be laminated using a well-known method for forming an oxide thin film, for example, a physical vapor deposition method such as a sputtering method, a vacuum deposition method, a laser deposition method, an electron beam deposition method, or an ion beam assist deposition method (hereinafter, abbreviated as an IBAD method); a chemical vapor deposition (CVD) method; an metal organic thermal decomposition (MOD) method; or thermal spraying. Among these methods, particularly the metal oxide layer formed using the IBAD method is preferable from the viewpoints of obtaining high crystal orientation and a high effect of controlling the crystal orientation of the oxide superconductor layer and the cap layer. The IBAD method is a method of aligning a crystal axis by irradiating ion beams on a crystal deposition surface at a predetermined angle during vapor deposition. As the ion beams, argon (Ar) ion beams are commonly used. For example, the alignment layer formed of $Gd_2Zr_2O_7$, MgO, or $ZrO_2$—$Y_2O_3$ (YSZ) is particularly preferable because it can reduce a value of Δφ (FWHM: full width at half maximum) which is an index indicating the orientation degree in the IBAD method.

It is preferable that the cap layer be formed through processes of epitaxial growth on the surface of the alignment layer and selective growth of crystal grains in the in-plane direction. The cap layer formed as above may obtain a higher in-plane orientation degree than that of the alignment layer.

A material of the cap layer is not particularly limited as long as it can exhibit the above-described functions, and specific preferable examples of the material include $CeO_2$, $Y_2O_3$, $Al_2O_3$, $Gd_2O_3$, $ZrO_2$, $Ho_2O_3$, and $Nd_2O_3$. When the material of the cap layer is $CeO_2$, the cap layer may contain a Ce-M-O-based oxide in which part of Ce atoms are substituted with metal atoms or metal ions.

The cap layer can be formed using a PLD (pulse laser deposition) method, a sputtering method, or the like. As conditions of forming a $CeO_2$ layer using the PLD method, the $CeO_2$ layer can be formed in an oxide gas atmosphere of approximately between 0.6 Pa and 100 Pa at a substrate temperature of approximately between 500° C. and 1000° C. The thickness of the $CeO_2$ layer as the cap layer 5 only needs to be 50 nm or greater, but is preferably 100 nm or greater to obtain sufficient orientation. However, when the thickness is excessively large, crystal orientation deteriorates. Therefore, the thickness is preferably in a range of between 50 nm and 5000 nm.

As the oxide superconductor layer 5, the composition of a well-known oxide superconductor can be widely applied. As such an oxide superconductor, a material having a composition $REBa_2Cu_3O_y$ (wherein RE represents an rare earth element such as Y, La, Nd, Sm, Er, or Gd) can be used, and specific examples thereof include Y123 ($YBa_2Cu_3O_y$) and Gd123 ($GdBa_2Cu_3O_y$). In addition, it is needless to say that other oxide superconductors, for example, materials formed of other oxide superconductors having a high critical temperature which are represented by a composition $Bi_2Sr_2Ca_{n-1}Cu_nO_{4+2n+\delta}$ can be used. The thickness of the oxide superconductor layer 5 is approximately between 0.5 μm and 5 μm and is preferably uniform.

The protective layer 6 which is formed to cover a top surface of the oxide superconductor layer 5 is formed of Ag and can be formed using a film forming device such as a DC sputtering device or a RF sputtering device. In addition, the thickness of the oxide superconductor layer 5 is approximately between 1 μm and 30 μm. The protective layer 6 according to the embodiment is mainly formed on the top surface of the oxide superconductor layer 5 using a film forming device. However, since the protective layer 6 is formed while allowing the tape-shaped substrate 3 to travel inside a chamber of a film forming device, both side surfaces of the substrate 3, both side surfaces of the intermediate layer 4, both side surfaces of the oxide superconductor laminate layer 5, and a back surface of the substrate 3 are surrounded by film-forming particles of the protective layer 6. Accordingly, constitutional element particles of the protective layer 6 are slightly deposited on both the side surfaces of the substrate 3, both the side surfaces of the intermediate layer 4, both the side surfaces of the oxide superconductor laminate layer 5, and the back surface of the substrate 3.

When the surrounding deposition of Ag particles occurs, a solder layer 7 comes into close contact with the back surface and the side surfaces of the HASTELLOY substrate 3 formed of a nickel alloy. However, when the surrounding deposition of the Ag particles does not occur, there is a concern that the solder layer 7 may not come into close contact with the HASTELLOY substrate 3 formed of a nickel alloy.

In addition, the metal tape 2 formed of a conductive material such as copper is provided so as to cover a front surface (protective front surface) and both side surfaces of the protective layer 6, both side surfaces of the oxide superconductor laminate layer 5 that is formed below the protective layer 6, both side surfaces of the intermediate layer 4, both side surfaces of the substrate 3, and both end portions 3a (back surface both end portions) on the back surface side of the substrate 3.

The metal tape 2 is formed of, for example, a highly conductive metal material and, along with the protective layer 6, functions as a bypass for commutating a current when the oxide superconductor layer 5 is switched from the superconducting state to the normal conducting state. A material forming the metal tape 2 is not particularly limited as long as it has high conductivity, but it is preferable that a relatively cheap material be used, for example, copper, a copper alloy such as brass (Cu—Zn alloy) or Cu—Ni alloy, Al, or Cu—Al alloy. It is preferable that the metal tape be formed of copper among the above-described examples from the viewpoints of high conductivity and cheapness. When the oxide superconductor wire A is used for a superconducting fault current limiter, the metal tape 2 is formed of a high-resistance metal material, for example, a Ni-based alloy such as Ni—Cr. The thickness of the metal tape 2 is not particularly limited and can be appropriately adjusted, but is preferably between 15 μm and 300 μm and more preferably between 20 μm and 300 μm.

The solder layer (low melting point metal layer) 7 is formed on both front and back surfaces of the metal tape 2. This solder layer 7 includes an outside coating layer 7a that covers an outside surface of the metal tape 2, inside coating layers 7b that come into contact with inside surfaces of the metal tape 2 and cover an periphery of the oxide superconductor laminate 1, and coating portions 7c that cover tip portions of both end portions of the metal tape 2.

The metal tape 2 and the solder layer 7 will be described in more details. The metal tape 2 is bent such that a cross-section has a about C-shape and includes a front surface wall 2a, side surface walls 2b, and back surface walls 2c. A portion of the oxide superconductor laminate 1 ranging from the protective layer 6 to the back surface both end portions 3a of the substrate 3 is covered with the solder layer 7. That is, the front surface and both side surfaces of the protective layer 6, both side surfaces of the oxide superconductor layer 5, both side surfaces of the intermediate layer 4, both side surfaces of the substrate 3, and the back surface both end portions 3a of the substrate 3 are covered with the metal tape 2. Accordingly, the inside coating layers 7b of the solder layer 7 are provided to coat all the portions of the entire peripheral surface of the oxide superconductor laminate 1 which are covered with the metal tape 2. Further, the inside coating layers 7b completely bury gaps between the metal tape 2 and the oxide superconductor laminate 1. The center portion of the substrate 3 on the back surface side in the width direction is not covered with the back surface walls 2c of the metal tape 2. Accordingly, a recessed portion 2d is provided at the center portion of the back surface of the substrate 3 between the pair of back surface walls 2c of the metal tape 2.

In addition, the coating portions 7c of the solder layer 7 are formed to be thicker than the coating layers 7a and 7b so as to slightly protrude from the tip portions of the back surface walls 2c of the metal tape 2 to the recessed portion 2d. Further, the coating portions 7c of the solder layer 7 are provided to seal gaps between the tip portions of the back surface walls 2c of the metal tape 2 and the back surface of the substrate 3.

In this embodiment, the solder layer (low melting point metal layer) 7 is formed of a solder. However, the low melting point metal layer may be formed of a metal having a melting point of between 240° C. and 400° C., for example, Sn, a Sn alloy, or indium. When a solder is used, the solder may be formed of a Sn—Pb-based alloy, a Pb—Sn—Sb-based alloy, a Sn—Pb—Bi-based alloy, a Sn—Bi-based alloy, a Sn—Cu-based alloy, a Sn—Pb—Cu-based alloy, or a Sn—Ag-based alloy. When the melting point of the solder layer 7 is high, there is an adverse effect on the superconductivity of the oxide superconductor layer 5 during melting. Accordingly, it is preferable that the melting point of the solder layer 7 is low. From this point of view, a material having a melting point of preferably 350° C. or lower and more preferably approximately between 240° C. and 300° C. is used.

The thickness of the solder layer 7 is preferably in a range of between 1 μm and 10 μm and more preferably in a range of between 2 μm and 6 μm. When the thickness of the solder layer 7 is less than 1 μm, gaps between the oxide superconductor laminate 1 and the metal tape 2 are not completely filled with the solder layer 7, and thus gaps may be formed. Further, there is a concern that the constitutional elements of the solder layer 7 may be diffused while the solder is being melted so as to form an alloy layer with the copper tape 2 or the protective layer 6 formed of Ag. On the other hand, when the thickness of the solder layer 7 is greater than 10 μm, the solder is melted and soldered by being heated and pressed by a roll described below, the amount of the solder extending from the tip portions of the back surface walls 2c of the metal tape 2 is increased, and the thickness of the coating portions 7c is increased more than necessary. As a result, there is a high possibility that irregular winding may occur during the winding of the oxide superconductor wire A.

In the oxide superconductor wire A having a structure illustrated in FIG. 1, the solder layer 7 which fills the gaps between oxide superconductor laminate 1 and the metal tape 2 provided near the oxide superconductor laminate 1 covers the periphery of the oxide superconductor laminate 1. Accordingly, moisture infiltration from the outside to the oxide superconductor layer 5 positioned inside the metal tape 2 can be prevented.

In addition, the coating portions 7c of the solder layer 7 cover the gaps between both the end portions of the metal tape 2 and the back surface of the substrate 3, the coating portions 7c being formed to be thicker than the coating layers 7a and 7b so as to slightly protrude outward from the back surface walls 2c of the metal tape 2 which covers the back surface end portions of the substrate 3. Accordingly, there is an effect capable of reliably preventing moisture infiltration from the end portions of the metal tape 2 to the inside of the metal tape 2.

In addition, the coating portions 7c, which are formed of the solder coating the end portions of the back surface walls 2c of the metal tape 2, slightly extend to the recessed portion 2d that is formed between both the end portions of the metal tape 2. The thickness of the protruding portions is not particularly increased compared to the thickness of the metal tape 2. Accordingly, when the oxide superconductor wire A including the coating portions 7c on the back surface of the substrate 3 is coiled, there is no significant step difference, and irregular winding is not likely to occur during coiling.

In addition, when multiple layers of the oxide superconductor wire are wound around a former to form a superconducting cable, irregular winding is not likely to occur.

Figure 3A:
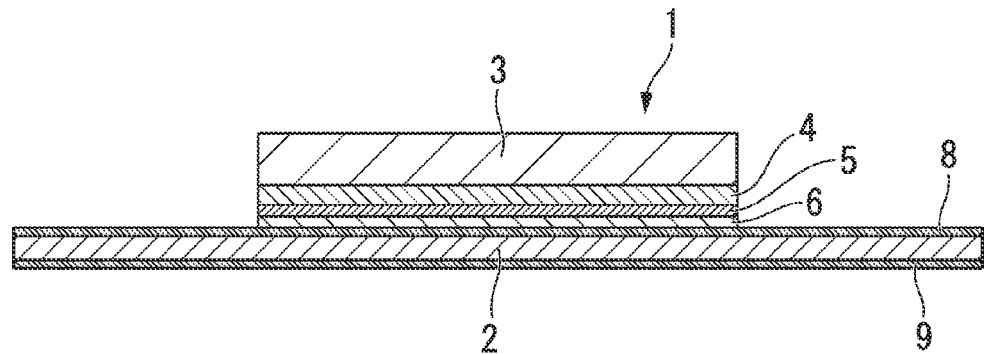
FIG. 3A is a cross-sectional view illustrating a state where a copper tape is disposed along the oxide superconductor laminate in a method of manufacturing the oxide superconductor wire illustrated in FIG. 1.

In order to manufacture the oxide superconductor wire A having the structure illustrated in FIG. 1, as illustrated in FIG. 3A, the tape-shaped oxide superconductor laminate 1 in which the substrate 3, the intermediate layer 4, the oxide superconductor layer 5, and the protective layer 6 are laminated is prepared. The metal tape 2 is disposed below the protective layer 6 of the oxide superconductor laminate 1 such that the protective layer 6 faces downward. On the front and back surfaces of the metal tape 2 used herein, solder layers 8 and 9 are formed by plating. It is preferable that these solder layers 8 and 9 have a thickness of approximately between 2 μm and 6 μm. In the present invention, it is not necessary that a solder layer be provided on both of the front and back surfaces of the metal tape 2, and the metal tape 2 only one surface of which covers the protective layer 6 and is provided with the solder layer may be used.

Next, the center portion of the metal tape 2 is aligned to match with the center portion of the bottom of the oxide superconductor laminate 1, and the metal tape 2 is shaped using a forming roll or the like such that both the end portions of the metal tape 2 are bent upward along both the end portions of the substrate 3. Next, both the end portions of the metal tape 2 are further bent inward along both the ends of the substrate 3. The metal tape 2 is bent in a C-shape in cross-section such that both the end portions of the substrate 3 are surrounded by the metal tape 2.

In this state, the entire body is heated to a melting point of the solder layers 8 and 9 in a heating furnace. Next, the metal tape 2 bent in a C-shape and the oxide superconductor laminate 1 are pressed using a press roll heated to a temperature which is lower than the melting point of the solder layers 8 and 9 by approximately 50° C. When the melting point of the solder layers 8 and 9 used herein is, for example, between 240° C. and 350° C., it is preferable that the temperature of the press roll be selected in a range of between 190° C. and 300° C. which is lower than this melting point by 50° C.

Through this process, the solder layers 8 and 9 are melted and spread so as to completely bury and fill the gaps between the oxide superconductor laminate 1 and the metal tape 2. Next, the entire body is cooled to solidify the melted solder, the oxide superconductor wire A having the same structure as that of FIG. 1 including the solder layer 7 as illustrated in FIG. 3C can be obtained.

Figure 4:
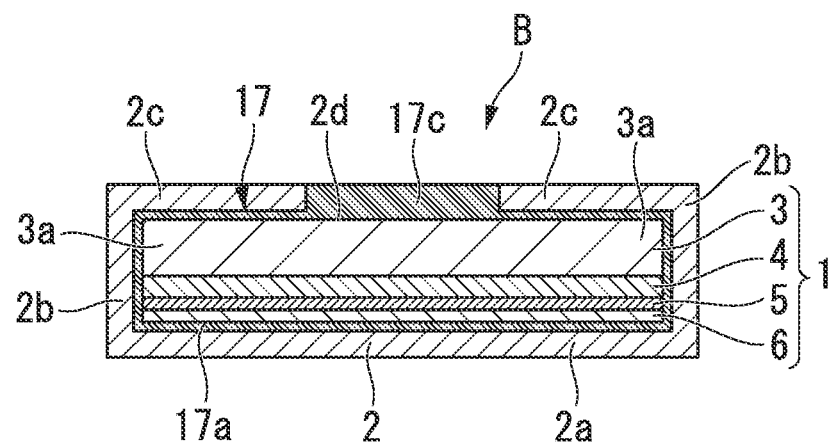
FIG. 4 is a cross-sectional view illustrating an oxide superconductor wire according to a second embodiment of the present invention.

FIG. 4 is a cross-sectional view illustrating an oxide superconductor wire according to a second embodiment of the present invention. As in the case of the oxide superconductor wire A according to the first embodiment, in the oxide superconductor wire B according to the second embodiment, the tape-shaped oxide superconductor laminate 1 provided inside the oxide superconductor wire B is covered with the metal tape 2 formed of a conductive material such as copper.

The oxide superconductor wire B according to this embodiment and the oxide superconductor wire A according to the first embodiment are different from each other, in that an inside coating layer 17a of a solder layer (low melting point metal layer) 17 is formed only on an inner peripheral surface of the metal tape 2; and an end portion of the recessed portion 2d that is formed between the tip portions of the pair of back surface walls 2c of the C-shaped metal tape 2 is buried with an burying layer 17c that is formed of the solder layer (low melting point metal layer).

In the oxide superconductor wire B having a structure illustrated in FIG. 4, the other structures are the same as those of the oxide superconductor wire A according to the first embodiment. Therefore, the same structures are represented by the same reference numerals, and the descriptions thereof will not be repeated.

In the oxide superconductor wire 13 illustrated in FIG. 4, the gaps between the oxide superconductor laminate 1 and the metal tape 2 are filled with the inside coating layer 17a, and the gap portion between the back surface walls 2c of the metal tape 2 is buried with the burying layer 17c. Accordingly, the burying layer 17c suppresses moisture infiltration and suppresses moisture infiltration into the oxide superconductor layer 5 inside the metal tape 2.

Even in a structure where the solder layer is not provided on the outside surface of the metal tape 2 as in the oxide superconductor wire B illustrated in FIG. 4, by providing the inside coating layer 17a on the inside surface of the metal tape 2 and providing the burying layer 17c, a structure capable of preventing moisture infiltration into the inside can be realized.

Figure 3B:
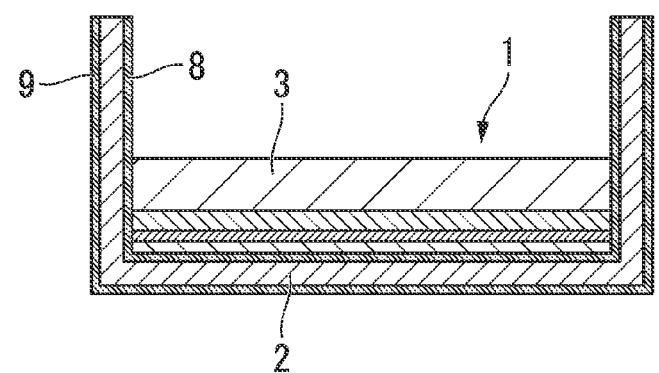
FIG. 3B is a cross-sectional view illustrating an example of a state where the copper tape disposed along the oxide superconductor laminate is bent in the method of manufacturing the oxide superconductor wire illustrated in FIG. 1.
Figure 3C:
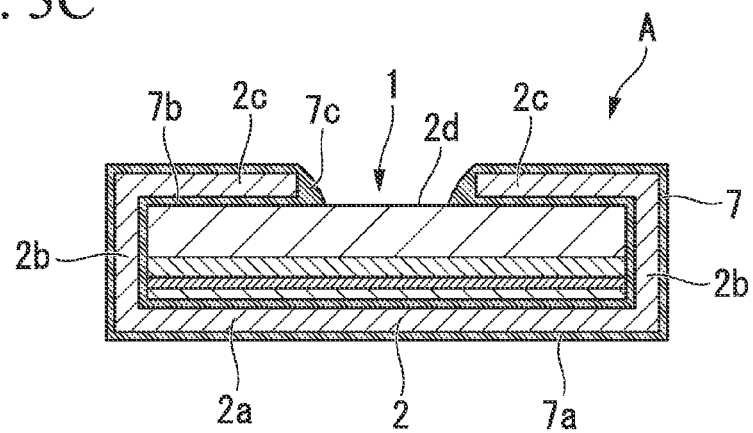
FIG. 3C is a cross-sectional view illustrating a state where the copper tape is soldered to the oxide superconductor laminate in the method of manufacturing the oxide superconductor wire illustrated in FIG. 1.

In order to manufacture the oxide superconductor wire B illustrated in FIG. 4, only one surface of the metal tape 2 may be provided with the solder layer through the same processes as the processes of FIGS. 3A to 3C, this metal tape 2 may be bent with the same method as that illustrated in FIGS. 3A to 3C, and the solder layer may be heated, melted, and pressed by a roll.

By using any means, for example, by adjusting the thickness of the solder layer provided on one surface of the metal tape 2 or by separately supplying a solder to a press roll, the amount of the solder is adjusted to the extent that the gap portion between the pair of the back surface walls 2c of the metal tape 2 is filled with the burying layer 17c. As a result, the oxide superconductor wire B having the structure illustrated in FIG. 4 can be obtained. It is necessary that the thickness of the solder layer provided on one surface of the metal tape 2 be at least 2 µm. In addition, in order to supply the solder layer, a method including: supplying an Sn foil or an Sn wire to the gap portion between the pair of back surface walls 2c of the metal tape 2; melting the Sn foil or the Sn wire to bury the gap portion and join the metal tape and the oxide superconductor laminate to each other can be adopted.

Figure 5:
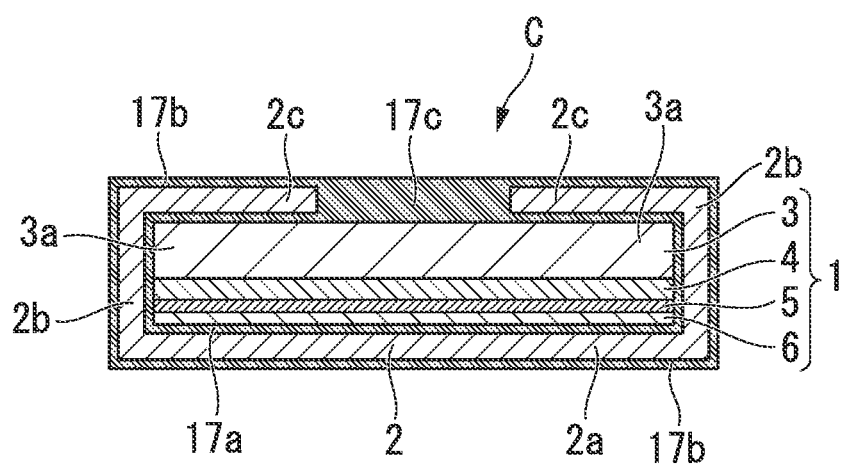
FIG. 5 is a cross-sectional view illustrating an oxide superconductor wire according to a third embodiment of the present invention.

FIG. 5 is a cross-sectional view illustrating an oxide superconductor wire according to a third embodiment of the present invention. The oxide superconductor wire C according to this embodiment is the same as the oxide superconductor wire A according to the first embodiment, in that the tape-shaped oxide superconductor laminate 1 provided inside the oxide superconductor wire C is covered with the metal tape 2 which is formed of a conductive material such as copper.

The oxide superconductor wire C according to this embodiment is different from the oxide superconductor wire B according to the second embodiment, in that an outside coating layer 17b of the solder layer (low melting point metal layer) 17 is formed on an outside peripheral surface of the metal tape 2. In addition, the oxide superconductor wire C according to this embodiment is the same as the oxide superconductor wire B according to the second embodiment, in that the recessed portion 2d that is formed between the tip portions of the back surface walls 2c of the C-shaped metal tape 2 is buried with the burying layer 17c that is formed of the solder layer (low melting point metal layer).

In the oxide superconductor wire C having a structure illustrated in FIG. 5, the other structures are the same as those of the oxide superconductor wire B according to the second embodiment. Therefore, the same structures are represented by the same reference numerals, and the descriptions thereof will not be repeated.

In the oxide superconductor wire C illustrated in FIG. 5, the gaps between the oxide superconductor laminate 1 and the metal tape 2 are filled with the inside coating layer 17a, the entire outer peripheral surface of the metal tape 2 is covered with the outside coating layer 17b, and the gap portion between the pair of the back surface walls 2c of the metal tape 2 is buried with the burying layer 17c. Accordingly, the inside coating layer 17a, the outside coating layer 17b, and the burying layer 17c suppress moisture infiltration, and moisture infiltration into the oxide superconductor layer 5 disposed inside the metal tape 2 is prevented.

In a structure where the outside surface and the inside surface of the metal tape 2 are provided with the solder layer as in the oxide superconductor wire C illustrated in FIG. 5, by further providing the burying layer 17c, a structure capable of preventing moisture infiltration into the inside can be realized.

In order to manufacture the oxide superconductor wire C illustrated in FIG. 5, both surfaces of the metal tape 2 may be provided with the solder layer through the same processes as the processes of FIGS. 3A to 3C, this metal tape 2 may be bent with the same method as that illustrated in FIGS. 3A to 3C, and the solder layer may be heated, melted, and pressed by a roll.

By using any means, for example, by adjusting the thickness of the solder layer provided on both surfaces of the metal tape 2 or by separately supplying a solder to a press roll, the amount of the solder is adjusted to the extent that the gap portion between the pair of the back surface walls 2c of the metal tape 2 is filled with the burying layer 17c. As a result, the oxide superconductor wire C having the structure illustrated in FIG. 5 can be obtained.

Figure 6:
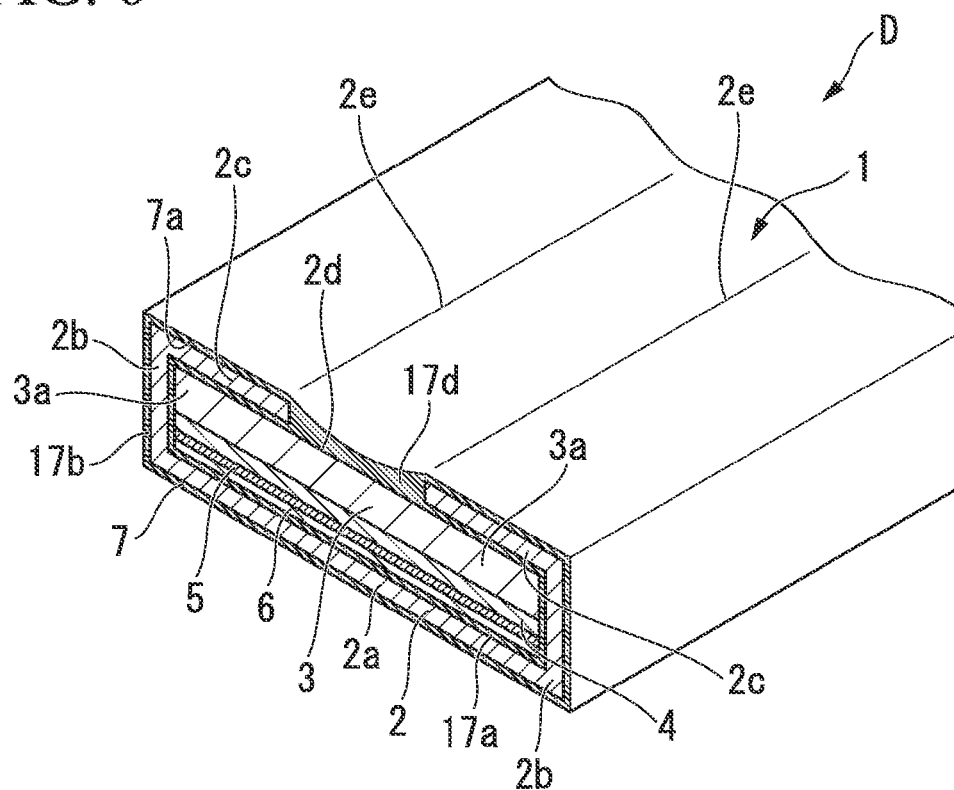
FIG. 6 is a perspective view illustrating an oxide superconductor wire according to a fourth embodiment of the present invention in which a part of the oxide superconductor wire is illustrated as a cross-section.

In an oxide superconductor wire D illustrated in FIG. 6, the gaps between the oxide superconductor laminate 1 and the metal tape 2 are filled with the inside coating layer 17a, the entire outer peripheral surface of the metal tape 2 is covered with the outside coating layer 17b, and the recessed portion 2d that is formed between the pair of the back surface walls 2c of the metal tape 2 is buried with a burying layer 17d. Accordingly, the inside coating layer 17a, the outside coating layer 17b, and the burying layer 17d suppress moisture infiltration, and moisture infiltration into the oxide superconductor layer 5 disposed inside the metal tape 2 is prevented.

In the structure according to the embodiment, the burying layer 17d is formed so as not to protrude outward from an upper edge position of the recessed portion 2d (from an opening position of the recessed portion 2d which is formed of a pair of upper tip edges 2e of the pair of back surface walls 2c of the metal tape 2). That is, the burying layer 17d is formed inside the recessed portion 2d such that the surface of the burying layer 17d is positioned further inside from the opening position of the recessed portion 2d which are formed by the pair of upper tip edges 2e of the pair of back surface walls 2c of the metal tape 2.

In a structure where the outside surface and the inside surface of the metal tape 2 are provided with the solder layer as in the oxide superconductor wire D illustrated in FIG. 6, by further providing the burying layer 17d, a structure capable of preventing moisture infiltration into the inside can be realized.

Figure 7A:
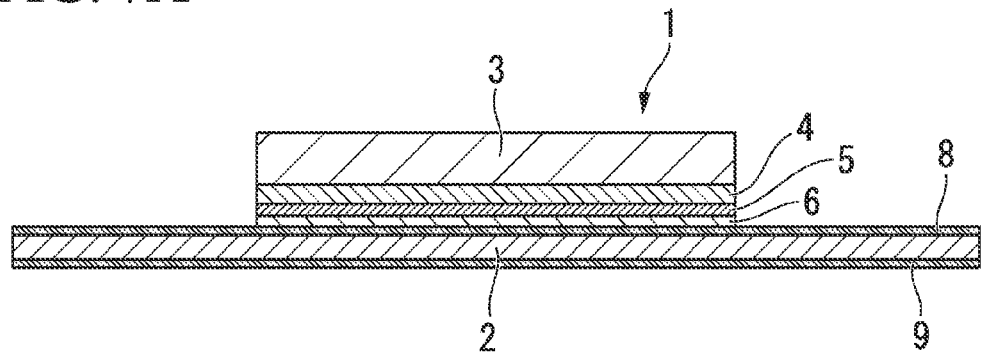
FIG. 7A is a cross-sectional view illustrating a state where a copper tape is disposed along the oxide superconductor laminate in a method of manufacturing the oxide superconductor wire illustrated in FIG. 6.
Figure 7B:
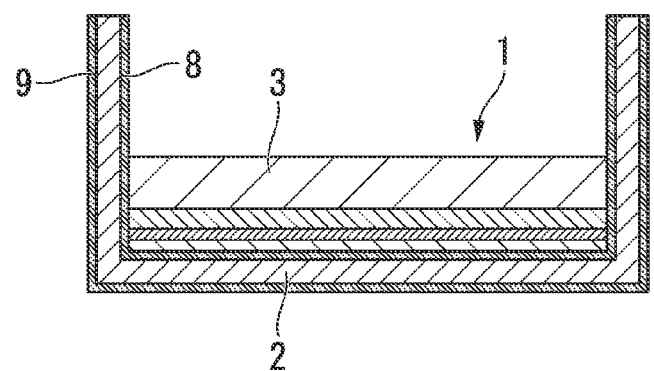
FIG. 7B is a cross-sectional view illustrating an example of a state where the copper tape disposed along the oxide superconductor laminate is bent in the method of manufacturing the oxide superconductor wire illustrated in FIG. 6.
Figure 7C:
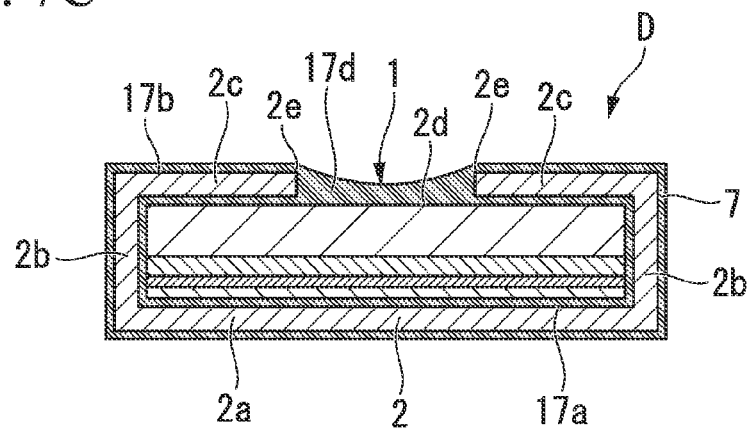
FIG. 7C is a cross-sectional view illustrating a state where the copper tape is soldered to the oxide superconductor laminate in the method of manufacturing the oxide superconductor wire illustrated in FIG. 6.

In order to manufacture the oxide superconductor wire D illustrated in FIG. 6, processes illustrated in FIGS. 7A to 7C which are the same as the processes illustrated in FIG. 3A to 3C are adopted. That is, both surfaces of the metal tape 2 may be provided with the solder layer, this metal tape 2 may be bent with a method illustrated in FIGS. 7A to 7C which is the same method as that illustrated in FIGS. 3A to 3C, and the solder layer may be heated, melted, and pressed by a roll. As a result, the oxide superconductor wire D can be manufactured.

By using any method, for example, by adjusting the thickness of the solder layer provided on both surfaces of the metal tape 2 or by separately supplying a solder to a press roll, the amount of the solder is adjusted to the extent that the recessed portion 2d provided between the pair of the back surface walls 2c of the metal tape 2 is filled with the burying layer 17c. As a result, the oxide superconductor wire D having the structure illustrated in FIG. 6 can be obtained. By further providing the solder in this way, the amount of the burying layer 17c can be sufficiently secured.

By providing the burying layer 17d so as not protrude outward from an opening position of the recessed portion 2d (an upper end position corresponding to the surfaces of the end portions of the metal tape 2) as in the structure illustrated in FIG. 6, moisture infiltration to the inside of the metal tape can be prevented. When the metal tape 2 adopts a structure in which the outside coating layer 17b is provided on the surface thereof, the substantial surface of the metal tape 2 is the surface of the outside coating layer 17b. Accordingly, the burying layer 17d is formed at a thickness at which the burying layer 17d does not protrude outward from the surface of the outside coating layer 17b.

In addition, in a case where a second layer and the subsequent layers are wound around a first layer during coiling, for example, even when a first layer of the oxide superconductor wire D is disposed to overlap a second layer of the oxide superconductor wire D, there is no protruding portions. Therefore, irregular winding does not occur.

In addition, the present inventors have studied in various ways in order to further increase the reliability of the structure capable of preventing moisture infiltration and have found that it is important to secure the contact length between the metal tape 2 and the back surface of the oxide superconductor laminate 1 to be a predetermined value or higher and to bury the gaps with the melted solder. That is, on the back surface of the oxide superconductor laminate 1, when the recessed portion 2d that is formed in the gap portion between the bent ends of the metal tape 2 is sealed with the solder using a method such as dipping, the gap portion can be reliably sealed with the solder by securing the length of the gap portion in the width direction (the width of the recessed portion 2d) to be a predetermined value or lower. It is considered that a correlation between the sealing mechanism and the length of the gap portion in the width direction is mainly determined by the surface tension of the solder.

Based on the above points, the width of the recessed portion 2d is preferably 2.0 mm or less. By setting the width of the recessed portion 2d to be 2.0 mm or less, the low melting point metal is sufficiently spread inside the recessed portion 2d by the surface tension to bury the gap portion. Therefore, a structure having high reliability in preventing moisture infiltration can be provided.

Figure 9:
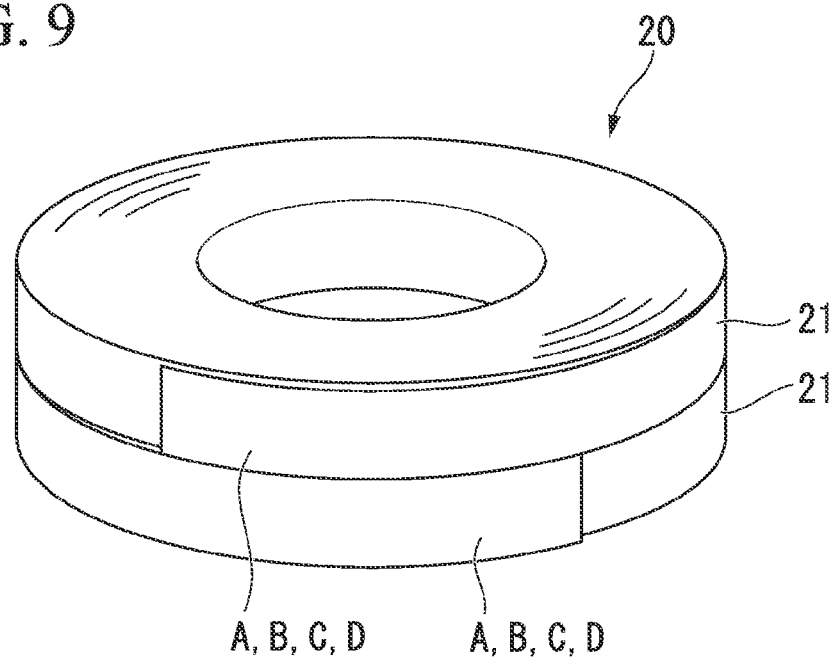
FIG. 9 is a diagram illustrating a superconducting coil including the oxide superconductor wire according to the present invention.

In addition, a coil body 21 may be formed by winding the oxide superconductor wire according to the present invention, and a superconducting coil 20 may be formed by laminating a required number of coil bodies (FIG. 9).

Figure 10:
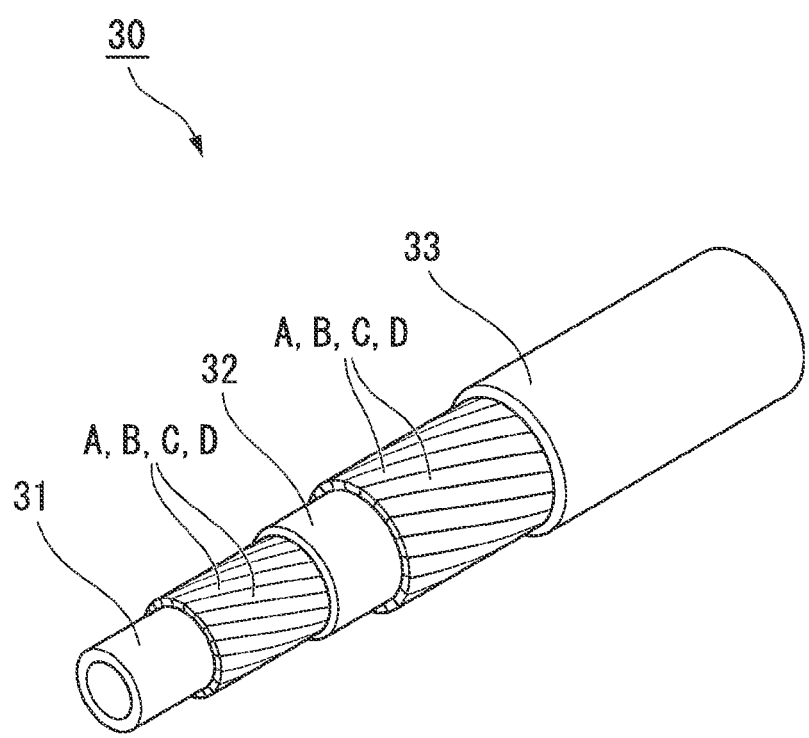
FIG. 10 is a diagram illustrating a superconducting cable including the oxide superconductor wire according to the present invention.

Further, a superconducting cable 30 may be formed by sequentially providing a first oxide superconductor wire according to the present invention, an electrically insulating layer 32, a second oxide superconductor wire according to the present invention, and a shielding layer 33 formed of a highly conductive metal material such as copper on an outer peripheral side of a former 31 that is disposed in the center and has a stranded wire structure (FIG. 10).

EXAMPLES

Hereinafter, the present invention will be described in detail using examples but is not limited to these examples.

A tape-shaped oxide superconductor laminate was prepared in which an $Al_2O_3$ diffusion prevention layer (thickness: 80 nm), a $Y_2O_3$ bed layer (thickness: 30 nm), an MgO intermediate layer (thickness: 10 nm) which was formed using an ion beam assist deposition method, a $CeO_2$ cap layer (thickness: 300 nm) which was formed using a PLD method, an oxide superconductor layer (thickness: 1 μm) having a composition represented by $YBa_2Cu_3O_{7-x}$, and an Ag protective layer (thickness: 10 μm) which was formed using a DC sputtering method were laminated on a tape-shaped substrate which was formed of HASTELLOY C-276 (trade name, manufactured by Haynes International Inc.) and had a thickness of 100 μm, a width of 5 mm, and a length of 10 m. The thickness of the oxide superconductor laminate ranging from the substrate to the protective layer was approximately 110 μm.

The oxide superconductor laminate was annealed with oxygen at 500° C. Next, a copper tape which had a thickness of 20 μm and a width of 10 mm and included both surfaces on which a Sn plating layer having a thickness of 2 μm was formed was disposed along an outer surface of the Ag protective layer as illustrated in FIG. 3A, and both end portions of the copper tape in a width direction were bent in a U shape. Next, both end portions of the copper tape were shaped to be bent to the back surface of the substrate.

Next, the entire body was pressed in a thickness direction using a press roll heated to 200° C. while being caused to pass through a heating furnace at 260° C. to melt Sn, and thus the thickness of Sn melted and present on the front and back surfaces was uniform. Due to this heating and pressing treatment using the press roll, gaps between the copper tape and the oxide superconductor laminate provided inside the copper tape were buried with the melted tin, and a part of the melted tin slightly extended outward from gaps between both end portions of the copper tape and the back surface of the substrate. As a result, an oxide superconductor wire having coating portions illustrated in FIG. 3C was obtained.

Maximum and minimum values of the thickness of 10 m of the obtained oxide superconductor wire were measured using a laser displacement meter. Since a range of the laser displacement meter for each scanning is 1 mm in the width direction, the average value in this range was obtained as a measured value. In the measurement, the scanning range of the laser displacement meter necessarily included the end portions of the copper tape on the substrate back surface side, and the measured value was obtained as data including information regarding the thickness of a gap portion between the end portions of the copper tape on the substrate back surface side.

Figure 8:
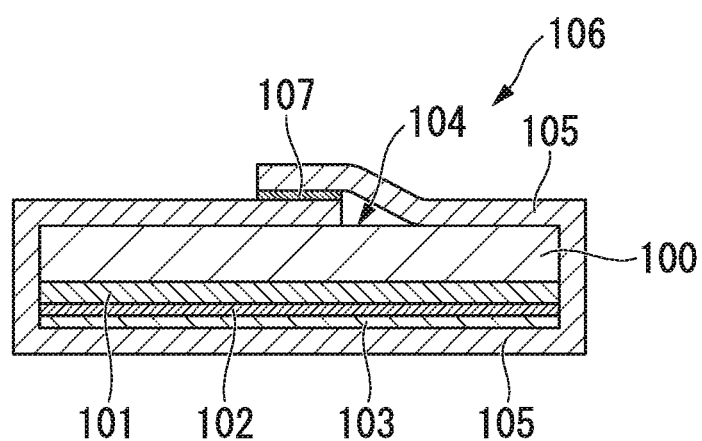
FIG. 8 is a cross-sectional view illustrating an example of an oxide superconductor wire of the related art.

In a structure illustrated in FIG. 8 in which the periphery of the oxide superconductor laminate was covered with the copper tape, and both end portions of the copper tape in the width direction overlap each other, the same test as above was performed for comparison.

The measurement results of these samples are collectively shown in Table 1 below.

TABLE 1

|  | Maximum Thickness (μm) | Minimum Thickness (μm) | Theoretical Value (μm) |
|---|---|---|---|
| Structure where End Portions of Copper Tape Overlap Each Other | 207 | 183 | 176 |
| Structure where Both Surfaces of Copper Tape were Plated with Sn | 167 | 154 | 158 |

As shown in the test results of Table 1, the dimensional tolerance of the sample in which the Sn plating was formed on both surfaces was ±10 μm or less (7%). In consideration of use of the copper tape and the substrate in which the dimensional tolerances of the thickness of the copper tape and the thickness of the metal substrate were within 5%, the dimensional tolerance of the copper tape which was formed using the above-described manufacturing method can be considered substantially 0.

In addition, a reliability test (pressure cooker test, 1 atm, 100° C., humidity: 100%, test time: 25 to 100 (h; hours)) was performed using samples one surface of which was plated with Sn and samples both surfaces of which were plated with Sn, and the results thereof are shown in Table 2 below.

In Table 2, the number of samples with decreased characteristics refer to the number of oxide superconductor wires samples of which the current values were decreased by 10% or higher compared to the current values of the oxide superconductor wires (the number of samples) which were measured before the test.

TABLE 2

|  | Number of Samples | Number of Samples with Decreased Characteristics | | | |
|---|---|---|---|---|---|
|  |  | 25 h | 50 h | 75 h | 100 h |
| Samples One Surface of which was Plated with Sn | 10 | 0 | 0 | 2 | 3 |
| Samples Both Surfaces of which were Plated with Sn | 10 | 0 | 0 | 0 | 0 |

According to the test results of Table 2, a decrease in current value was not observed after 50 hours in the pressure cooker test of the samples one surface of which was plated with Sn, and a decrease in current value was not observed after 100 hours in the pressure cooker test of the samples both surfaces of which were plated with Sn. The pressure cooker test was an extremely hash acceleration test in consideration of conditions for testing the moisture resistance of a oxide superconductor wire. That is, withstanding for 50 hours in the pressure cooker test implies that moisture resistance is superior to the extent that there are no problems during normal use, and withstanding for 100 hours in the pressure cooker test implies that there are no problems in reliability when being used as an industrial material.

From this point of view, the oxide superconductor wire according to the present invention can obtain a fine moisture infiltration preventing effect in any of the single-surface-Sn-coated structure and the both-surface-Sn-coated structure.

Next, using the above-described oxide superconductor laminates (length: 1 m) including the layers up to the Ag protective layer, plural metal tapes which were annealed with oxygen using the same method as above, included both surfaces on which a Sn plating layer having a thickness of 2 μm was formed, and had a thickness of 20 μm and different widths were disposed along the outer surface of the Ag protective layers as illustrated in FIG. 7A, respectively. Next, as illustrated in FIG. 7B, both end portions of the copper tapes in the width direction were bent in a U shape. Next, as illustrated in FIG. 7C, both end portions of the copper tapes were shaped to be bent to the back surface of the substrate in a C shape. As a result, plural superconductor wire samples coated with the copper tapes having different widths were obtained.

Next, the superconductor wire samples were pressed in a thickness direction using a press roll heated to 200° C. while being caused to pass through a heating furnace at 260° C. to melt Sn, and thus the thickness of Sn melted and present on the front and back surfaces was uniform. Due to this heating and pressing treatment using the press roll, gaps between the copper tapes and the oxide superconductor laminates provided inside the copper tapes were buried with the melted tin, and a part of the melted tin slightly extended outward from gaps between both end portions of the copper tapes and the back surfaces of the substrates. Further, in a conductive portion of each of the superconductor wires, a burying layer illustrated in FIG. 7C was manually formed using a soldering iron. As a result, oxide superconductor wires were obtained.

The thicknesses of the copper tapes used for coating the oxide superconductor wires are shown in Table 3 below.

10 superconductor wires coated with the metal tapes having the respective widths were prepared, and a pressure cooker test (PCT test) was performed at 100° C. and a humidity of 100% under 1 atm for 100 hours.

TABLE 3

|  | Thickness of Copper Tape (μm) | Number of Samples with Decreased Characteristics |
|---|---|---|
| Comparative Example 1 | 5 | 9 |
| Comparative Example 2 | 10 | 7 |
| Example 1 | 15 | 2 |
| Example 2 | 20 | 0 |
| Example 3 | 35 | 0 |
| Example 4 | 50 | 0 |
| Example 5 | 100 | 0 |

As can be seen from the results of Table 3, when the thickness of the metal tape was less than 20 μm, the less thickness of the copper tape, the more number of samples with decreased characteristics. In addition, when the thickness of the copper tape was 15 μm or greater, the results of the characteristic test were significantly improved. When the thickness of the copper tape was 20 μm or greater, there were no samples with decreased characteristics. When the thickness of the copper tape was 10 μm or less, the tape was too thin, and the possibility of fracture during operation was increased.

Next, the coating length of the copper tape covering end portions of the substrate back surface of the oxide superconductor laminate (the coating width when the end portions of the copper tape coating the end portions of the substrate back surface) was tested.

The thickness of the copper tape was fixed to 20 μm such that changes in the thickness of the copper tape did not affect the test. In addition, oxide superconductor wires having a structure in which the above-described oxide superconductor laminate was shaped in a C shape by the above-described press rolling and was coated with the copper tape were prepared. As illustrated in FIG. 3C, the structure provided in this test was a structure provided with coating portions in which the recessed portion between the end portions of the copper tape was not completely covered with the solder and was a structure including no burying layer.

The coating length of the copper tape coating the superconductor laminate was changed as shown in Table 4 below, and the pressure cooker test was performed under the same conditions as those of the above test. The coating length described herein refers to the total width of both end portions of the C-shaped copper tape covering the substrate back surface. Therefore, the coating length (width) of one end of the C-shaped copper tape is half of a numerical value indicating the coating length. Accordingly, the coating length of one end of the copper tape was half of a numerical value of Table 4. The above results are shown in Table 4 below.

TABLE 4

|  | Coating Length of Metal Tape Covering Back Surface | Number of Samples with Decreased Characteristics |
|---|---|---|
| Comparative Example 3 | 0.5 | 10 |
| Comparative Example 4 | 1.0 | 8 |
| Comparative Example 5 | 1.3 | 4 |
| Example 6 | 1.5 | 1 |
| Example 7 | 2.0 | 1 |
| Example 8 | 2.5 | 0 |

According to the test results of Table 4, when the total coating length of both end portions of the metal tape was less than 1.5 mm, the number of samples with decreased characteristics was increased; however, when the coating length was 1.5 mm or greater, the number of samples with decreased characteristics was decreased. In addition, when the coating length was 2.5 mm or greater, there were no samples with decreased characteristics. Based on the above results, the following was considered: when the superconductor laminate was coated with the metal tape, the coating length of both surfaces of the metal tape in the width direction was preferably 1.5 mm or greater. When the coating length of one surface of the metal tape was 0.75 mm or greater, the number of samples with decreased characteristics was decreased. When the coating length was 1.25 mm or greater, there were no samples with decreased characteristics.

Next, when the non-coating length (the width of the recessed portion) of the metal tape coating the superconductor laminate was changed, the reliability was tested. According to the results of Table 3, when the coating length of the metal tape was 1.5 mm, the results were superior. Therefore, the test was performed under conditions that the coating length was fixed to 1.5 mm and the non-coating length (the width of the recessed portion) was changed. In the samples of Comparative Examples 6 and 7 in which the non-coating length was long, an oxide superconductor laminate having a width of 12 mm was used instead of the oxide superconductor laminate having a width of 5 mm.

Symbol O described in the item indicating the results of back surface sealing represents a case where the recessed portion was able to be covered with the burying layer of the solder as illustrated in FIG. 6, and Symbol X represents a sample in which the burying layer of the solder appeared to be formed; however, there were portions with which the metal tape was not in close contact during a visible dye penetrant test.

The visible dye penetrant test refers to a testing method (according to JIS Z2343) capable of detecting whether or not there were cracks, in which a sample was coated with a red penetrant or the like for the test, the penetrant attached on one end of the coated sample was washed with water and removed, a surface of the sample was dried, the sample was coated with a developing solution, and the penetrant which were infiltrated into cracks or the like present on the coating portions was bled out to the surface to draw an indication.

TABLE 5

|  | Width of Concave Portion (mm) | Back Surface Sealing | Number of Samples with Decreased Reliability |
|---|---|---|---|
| Example 9 | 0.2 | O | 0 |
| Example 10 | 0.5 | O | 0 |
| Example 11 | 0.7 | O | 0 |
| Example 12 | 0.9 | O | 0 |
| Example 13 | 1.2 | O | 0 |
| Example 14 | 1.8 | O | 0 |
| Example 15 | 2.0 | O | 0 |
| Comparative Example 6 | 2.1 | X | 1 |
| Comparative Example 7 | 2.3 | X | 2 |

It was found from the test results of Table 5 that, when the burying layer was formed inside the recessed portion using the solder, and when the width of the recessed portion was excessively large, the burying layer was not able to be in close contact with the inside of the recessed portion through the solder. Accordingly, it was found that the width of the recessed portion was necessarily 2.0 mm or less in order to obtain the burying layer in close contact with the inside of the recessed portion.

These results imply that a superior burying layer is obtained as long as the melted solder is uniformly spread inside the recessed portion by a surface tension; however, when the width of the recessed portion is excessively large, the solder does not reach the inside of the recessed portion even under the action of the surface tension.

Next, when a superconducting coil is manufactured using the oxide superconductor wire, it is preferable that a protruding portion not be formed on the front and back surfaces of the oxide superconductor wire in consideration of workability and dimensional effects during coiling. Therefore, after heating the shaped copper tape to melt the solder, the effects of press rolling was tested.

According to the results of Table 5, the following results were obtained: when the non-coating length (the width of the recessed portion) of the metal tape was 2.1 or greater due to the effect of the surface tension of the solder, the substrate was not able to be completely sealed.

Therefore, assuming that the width of the recessed portion was greater than 2.1 mm, a burying layer was formed by pressing the solder using a heating roll and further adding a solder to the recessed portion. As a result, a structure in which the inside of the recessed portion was completely buried with the solder was prepared to test a back surface sealing state. In the samples of Examples 20 and 21 in which the width of the recessed portion was large, an oxide superconductor laminate having a width of 12 mm was used instead of the oxide superconductor laminate having a width of 5 mm.

TABLE 6

| | Width of Concave Portion (mm) | Back Surface Sealing | Number of Samples with Decreased Reliability |
|---|---|---|---|
| Example 16 | 1.5 | 0 | 0 |
| Example 17 | 1.8 | 0 | 0 |
| Example 18 | 2.5 | 0 | 0 |
| Example 19 | 4.0 | 0 | 0 |
| Example 20 | 7.0 | 0 | 0 |
| Example 21 | 9.0 | 0 | 0 |

It was found from the results of Table 6 that, when the burying layer was formed by pressing the solder against the recessed portion using a roll and further adding the solder to the recessed portion, the reliability can be secured even at a width of the recessed portion of 1.5 mm to 9.0 mm by burying the recessed portion with the solder to be sealed. It was found from the above results that a structure capable of more completely preventing moisture infiltration can be provided by filling the recessed portion with a sufficient amount of solder.

The techniques according to the present invention can be used for an oxide superconductor wire used in various electric power apparatuses such as superconducting transmission lines, superconducting motors, or fault current limiters.

What is claimed is:

1. An oxide superconductor wire comprising:
   a tape-shaped oxide superconductor laminate including a metal tape-shaped substrate that has a substrate front surface and a substrate back surface, an intermediate layer that is provided on the substrate front surface, an oxide superconductor layer that is provided on the intermediate layer, and a protective layer that has a protective front surface and is provided on the oxide superconductor layer; and
   a coating member that is formed of a metal tape and a low melting point metal layer,
   wherein the metal tape has a wider width than that of the oxide superconductor laminate and covers the protective front surface, both side surfaces of the oxide superconductor laminate, and both end portions of the substrate back surface in a width direction thereof,
   both end portions of the metal tape in a width direction thereof are provided to cover both the end portions of the substrate back surface, and a recessed portion is defined by the both end portions of the metal tape and the substrate back surface,
   the low melting point metal layer fills gaps between the oxide superconductor laminate and the metal tape that is provided so as to surround the oxide superconductor laminate to join the metal tape and the oxide superconductor laminate to each other,
   the low melting point metal layer covers tip portions of both end portions of the metal tape in the width direction, and a part of the low melting point metal layer extends from the tip portions of the both end portions of the metal tape toward the recessed portion, and
   a total width of both end portions of the metal tape covering the end portions of the substrate back surface is 1.5 mm or greater.

2. The oxide superconductor wire according to claim 1, wherein the part of the low melting metal layer extending to the recessed portion buries the recessed portion and thereby forms burying layer, and the burying layer does not protrude outward from surface positions of both the end portions of the metal tape forming the recessed portion.

3. The oxide superconductor wire according to claim 2, wherein a total width of both end portions of the metal tape covering the end portions of the substrate back surface is 1.5 mm or greater.

4. The oxide superconductor wire according to claim 1, wherein a width of the recessed portion is 2.0 mm or less.

5. The oxide superconductor wire according to claim 2, wherein a width of the recessed portion is 2.0 mm or less.

6. The oxide superconductor wire according to claim 1, wherein the metal tape is a copper tape having a thickness of 15 μm or greater.

7. The oxide superconductor wire according to claim 2, wherein the metal tape is a copper tape having a thickness of 15 μm or greater.

8. The oxide superconductor wire according to claim 2, wherein the burying layer further includes another low melting point metal which is added from outside in addition to the part of the low melting point metal layer which fills the gaps between the oxide superconductor laminate and the metal tape.

9. The oxide superconductor wire according to claim 2, wherein the burying layer is formed such that the surface of the burying layer is positioned further inside from the surface positions of both the end portions of the metal tape forming the recessed portion.

10. A superconducting coil comprising the oxide superconductor wire according to claim 1.

11. A superconducting cable comprising the oxide superconductor wire according to claim 1.

12. A method of manufacturing an oxide superconductor wire comprising:
    preparing a tape-shaped oxide superconductor laminate that is formed by providing an intermediate layer on a front surface side of a metal tape-shaped substrate, providing an oxide superconductor layer on the intermediate layer, and providing a protective layer on the oxide superconductor layer, and preparing a metal tape that has a wider width than that of the oxide superconductor laminate and includes peripheral surfaces on which a low melting point metal plating layer is formed;
    allowing the metal tape to cover the oxide superconductor laminate such that the protective layer surface of the oxide superconductor laminate, both side surfaces of the oxide superconductor laminate, and both end portions of a substrate back surface in a width direction thereof are covered with the metal tape, and thereby defining a recessed portion by both end portions of the metal tape and the substrate back surface; and
    forming coating portions by heating the low melting point metal plating layer to a temperature to be in a melted state, pressing the low melting point metal layer with a roll such that gaps between the oxide superconductor laminate and the metal tape are buried with the low melting point metal layer, covering tip portions of both end portions of the metal tape in the width direction with the low melting point metal layer and allowing a part of the low melting point metal layer to extend from the tip portions of the both end portions of the metal tape toward the recessed portion,
    wherein a total width of both end portions of the metal tape covering the end portions of the substrate back surface is 1.5 mm or greater.

13. The method of manufacturing an oxide superconductor wire according to claim 12,
wherein a recessed portion which is formed between both the end portions of the metal tape covering the end portions of the substrate back surface is covered with the part of the low melting point metal layer extending outward to form a burying layer, the burying layer does not protrude outward from an opening position of the recessed portion.

14. An oxide superconductor wire comprising:
a tape-shaped oxide superconductor laminate including a metal tape-shaped substrate that has a substrate front surface and a substrate back surface, an intermediate layer that is provided on the substrate front surface, an oxide superconductor layer that is provided on the intermediate layer, and a protective layer that has a protective front surface and is provided on the oxide superconductor layer; and
a coating member that is formed of a metal tape and a low melting point metal layer,
wherein the metal tape has a wider width than that of the oxide superconductor laminate and covers the protective front surface, both side surfaces of the oxide superconductor laminate, and both end portions of the substrate back surface in a width direction thereof,
both end portions of the metal tape in a width direction thereof are provided to cover both the end portions of the substrate back surface,
the low melting point metal layer fills gaps between the oxide superconductor laminate and the metal tape that is provided so as to surround the oxide superconductor laminate to join the metal tape and the oxide superconductor laminate to each other,
a part of the filled low melting point metal layer extends to a recessed portion that is formed between both the end portions of the metal tape in the width direction, and
an entire outer peripheral surface of the metal tape is covered with the low melting point metal layer.

* * * * *